(12) United States Patent
Feng

(10) Patent No.: US 10,727,284 B2
(45) Date of Patent: Jul. 28, 2020

(54) METHOD OF FABRICATING ORGANIC LIGHT-EMITTING DIODE TOUCH DISPLAY SCREEN

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xiaoliang Feng, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/327,833

(22) PCT Filed: Dec. 3, 2018

(86) PCT No.: PCT/CN2018/119017
§ 371 (c)(1),
(2) Date: Feb. 24, 2019

(65) Prior Publication Data
US 2020/0161380 A1    May 21, 2020

(30) Foreign Application Priority Data

Nov. 15, 2018  (CN) .......................... 2018 1 1361832

(51) Int. Cl.
*H01L 21/00*    (2006.01)
*H01L 27/32*    (2006.01)
*G06F 3/041*    (2006.01)

(52) U.S. Cl.
CPC .......... *H01L 27/323* (2013.01); *G06F 3/0412* (2013.01); *H01L 27/3244* (2013.01);
(Continued)

(58) Field of Classification Search
CPC ............. H01L 27/323; H01L 2227/323; G06F 3/0412
See application file for complete search history.

(56) References Cited

U.S. PATENT DOCUMENTS 8,120,030 B2 * 2/2012 Godo ................ H01L 29/78696
257/57
8,158,975 B2 * 4/2012 Akimoto ............. H01L 29/7869
257/43
(Continued)

FOREIGN PATENT DOCUMENTS

CN        109616496 A  *  4/2019

*Primary Examiner* — Laura M Menz
(74) *Attorney, Agent, or Firm* — Mark M. Friedman

(57) ABSTRACT

A method of fabricating an organic light-emitting diode (OLED) touch display screen is provided and has steps of forming a thin film transistor (TFT) layer, an OLED layer, and a touch layer on a base substrate sequentially. Compared with prior art, upon fabricating a touch layer, a first insulating layer is not etched after depositing the first insulating layer and before depositing a bridging point layer. After depositing and forming a second insulating layer, the first and second insulating layers are dry-etched together using combination of two etching gases to achieve fabricating two different depths contact holes in the touch layer in a same process, which effectively reduces erosion of the OLED by a wet-etching process, simplifies a producing process, improves device-producing capacity, and simultaneously achieves a pre-protection effect on touch lines and bonding pads in a source-drain electrode layer to avoid functional failure caused by over-etching or oxidation.

10 Claims, 6 Drawing Sheets

(52) U.S. Cl.
CPC ............... *G06F 2203/04103* (2013.01); *H01L 2227/323* (2013.01)

(56) References Cited

U.S. PATENT DOCUMENTS

| | | | |
|---|---|---|---|
| 8,218,099 B2* | 7/2012 | Yamazaki | H01L 27/1225 349/43 |
| 10,224,382 B2* | 3/2019 | Cao | H01L 27/323 |
| 2011/0193801 A1* | 8/2011 | Jung | G06F 3/0412 345/173 |
| 2013/0082231 A1* | 4/2013 | Tada | G11C 13/0007 257/4 |
| 2013/0266724 A1* | 10/2013 | Cheong | G06F 3/041 427/97.2 |
| 2014/0247403 A1* | 9/2014 | Mun | G02F 1/13338 349/12 |
| 2017/0185181 A1* | 6/2017 | Kim | G02F 1/1345 |
| 2017/0262109 A1* | 9/2017 | Choi | H01L 27/3279 |
| 2019/0035857 A1* | 1/2019 | Cao | H01L 27/323 |
| 2019/0123113 A1* | 4/2019 | Kim | G03F 7/16 |
| 2019/0165327 A1* | 5/2019 | Ye | H01L 27/323 |
| 2019/0324580 A1* | 10/2019 | Tanaka | H01L 27/323 |
| 2020/0097116 A1* | 3/2020 | Choi | H01L 51/5253 |

* cited by examiner

METHOD OF FABRICATING ORGANIC LIGHT-EMITTING DIODE TOUCH DISPLAY SCREEN

FIELD OF DISCLOSURE

The present disclosure relates to displays, and more particularly, to a method of fabricating an organic light-emitting diode (OLED) touch display screen.

BACKGROUND OF DISCLOSURE

In flat panel display technologies, organic light-emitting diode (OLED) displays have many advantages, such as being light in weight, being thin, active emitting, fast responding rates, wide viewing angles, wide color gamut, high brightness, low power consumption, and so on, and have gradually become a third generation display technology after liquid crystal displays (LCDs). Compared to LCDs, OLED displays have advantages of higher power-saving, being thinner, and wider viewing angles, and therefore the OLED displays are unparalleled. At present, people have increasing demands on the degree of details of displaying, i.e., resolution. However, production of OLED display screens with high quality and high resolution still faces many challenges.

Currently, more commonly used touch technologies include an external touch technology and an in-cell touch technology. The in-cell touch technology integrates a touch sensor into a display panel. Since the in-cell touch technology can make a display device lighter and thinner than the external touch technology, the in-cell touch technology draws more attention in applying in OLED display devices. Taking a liquid crystal panel as an example. The external touch technology is a method of embedding a touch screen between a color filter substrate and a polarizer of a display screen, that is, a touch sensor is mounted in the liquid crystal panel. Compared with the in-cell touch technology, the external touch technology has much less difficulty.

With rapid development of a flexible display OLED technology, the touch screen required to be matched also needs to be flexible and foldable. A traditional touch screen needs to be separately fabricated, and then adhered to an upper surface of an OLED through an optical transparent adhesive to form a complete touch display module. An adhering process is increased, and an overall thickness is also increased simultaneously, which is unfavorable to an overall thinness and lightness of a flexible touch display screen.

In the development of an existing external OLED touch display technology, the touch sensor is generally fabricated on an OLED layer. A specific process is as follows: firstly, a thin film transistor (TFT) layer including the substrate is fabricated, and a source/drain (SD) electrode layer in the TFT layer includes a touch line and a bonding pad for a touch portion in a bonding region. Then, the OLED layer is fabricated on the TFT layer, and finally a touch layer is fabricated on the OLED layer, wherein the touch layer includes a first insulating layer, a bridging point layer, a second insulating layer, an electrode circuit layer, and a protective layer disposed from bottom to top in sequence, wherein the bridging point layer includes a plurality of metal bridges in a pixel region, and the electrode circuit layer includes a touch driving electrode, a touch sensing electrode, and a touch connecting wire. The touch driving electrode or the touch sensing electrode is connected to the metal bridges through a first contact hole penetrating the second insulating layer, and the touch connecting wire passes through a second contact holes penetrating the first insulating layer and the second insulating layer to connect with the touch lines in the bonding region. Then, in an etching process, since the pixel region and a metal bonding region need different etching depths, the prior art generally uses two photomasks to respectively etch the first insulating layer and the second insulating layer in the touch layer, so as to form vias with different depths in two ends of each of the metal bridges and in the metal bonding region. Therefore, an existing touch layer fabricating process requires at least five mask processes, but after each of the mask processes is completed, a portion of the SD layer for the touch lines and the bonding pad are etched and then exposed, so as to cause a surface of the SD layer damaged or oxidized, and electrical properties being reduced or even failed.

In addition, due to the hydrophobic nature of the OLED, when the touch layer is fabricated on the OLED layer, the OLED layer should be prevented from being excessively exposed to a wet etching process. However, a conventional etching process in the touch technology mainly adopts a wet process. Although a dry process can avoid a wet exposing, it also brings other technical problems, especially when fabricating the touch layer on a flexible OLED, in order to protect the structure, it is also necessary to consider the effect of a pre-protection process.

SUMMARY OF DISCLOSURE

An object of the present disclosure is to provide a method of fabricating an organic light-emitting diode (OLED) touch display screen. A first insulating layer and a second insulating layer are dry-etched together to achieve fabricating two different depths contact holes in a same process, which simplifies a producing process, saving device sources, and simultaneously achieves a pre-protection effect on a source-drain electrode layer to avoid oxidation or damage of the source-drain electrode layer.

To achieve the above object, the present disclosure provides a method of fabricating an OLED touch display screen. The OLED touch display screen comprises a pixel region located at a middle portion of the OLED touch display screen and a bonding region at an outer side of the pixel region. The method comprises:

a step S1 of providing a base substrate and forming a thin film transistor (TFT) layer and an OLED light emitting layer on the base substrate in sequence;

a step S2 of depositing and forming a first insulating layer on the OLED light emitting layer;

a step S3 of depositing, patterning, and forming a bridging point layer on the first insulating layer;

a step S4 of depositing and forming a second insulating layer on the bridging point layer and the first insulating layer; coating a photoresist material on the second insulating layer, and exposing and developing the photoresist material to obtain a photoresist layer;

a step S5 of performing a dry etching process on the first insulating layer and the second insulating layer by using the photoresist layer as a shielding layer, so as to form:

first contact holes passing through the second insulating layer and located above the bridging point layer in the pixel region; and second contact holes passing through the first insulating layer and the second insulating layer and formed in the bonding region;

wherein the dry etching process is specifically of: at first, etching the first insulating layer and the second insulating layer by a first etching gas until the first contact holes are formed or a thickness of the second insulating layer exposed by the photoresist layer is less than 100 Å, then continuing etching the first insulating layer and the second insulating layer by a second etching gas to form all of the first contact holes and the second contact holes, wherein an etching selectivity ratio of the second etching gas to the first insulating layer and the bridging point layer is greater than 5;

a step S6 of depositing, patterning, and forming an electrode circuit layer on the second insulating layer; and a step S7 of forming a protective layer on the second insulating layer and the electrode circuit layer.

In the step S5, the first etching gas has an etching rate of the second insulating layer greater than 100 Å/S, and the etching selectivity ratio of the second etching gas to the first insulating layer and the bridging point layer is greater than an etching selectivity ratio of the first etching gas to the first insulating layer and the bridging point layer.

In the step S5, the first etching gas comprises sulfur hexafluoride and oxygen.

In the step S5, the second etching gas comprises trichloromethane.

A material of both of the first insulating layer and the second insulating layer is silicon nitride.

In the step S1, the TFT layer comprises a source/drain electrode layer including touch lines in the bonding region;

in the step S3, the bridging point layer comprises a plurality of metal bridges in the pixel region; and in the step S6, the electrode circuit layer comprises at least two first electrodes, at least one second electrode, and a plurality of third electrodes, wherein the at least two first electrodes are connected with the metal bridges through the first contact holes, and the third electrodes are connected with the touch lines in the bonding region through the second contact holes.

In the step S3, a specific process of patterning and forming the bridging point layer comprises a photoresist coating step, an exposing step, a developing step, an etching step, and a photoresist removing step, all of which are performed in sequence, wherein the etching step of patterning the bridging point layer is performed by a dry etching process.

In the step S6, a specific process of patterning and forming the electrode circuit layer comprises a photoresist coating step, an exposing step, a developing step, an etching step, and a photoresist removing step, all of which are performed in sequence, wherein the etching step of patterning the electrode circuit layer is performed by a dry etching process.

In the step S7, a material of the protective layer is an inorganic material, and a specific process of forming the protective layer comprises a depositing inorganic material film step, a photoresist coating step, an exposing step, a developing step, an etching step, and a photoresist removing step, all of which are performed in sequence, wherein the etching step of forming the protective layer is performed by a dry etching process.

In the step S7, a material of the protective layer is an organic material, and a specific process of forming the protective layer comprises a organic material coating step, an exposing step, and a developing step, all of which are performed in sequence.

Beneficial effects of the disclosure is that: a method of fabricating an OLED touch display screen is provided and includes steps of forming a TFT layer, an OLED layer, and a touch layer on a base substrate sequentially. Compared with prior art, upon fabricating a touch layer, a first insulating layer is not etched after depositing the first insulating layer and before depositing a bridging point layer. After depositing and forming a second insulating layer, the first and second insulating layers are dry-etched together using combination of two etching gases to achieve fabricating two different depths contact holes in the touch layer in a same process, which effectively reduces erosion of the OLED by a wet-etching process, simplifies a producing process, improves device-producing capacity, and simultaneously achieves a pre-protection effect on touch lines and bonding pads in a source-drain electrode layer to avoid functional failure caused by over-etching or oxidation.

In order to further understand features and technical contents of the present disclosure, please refer to following detailed description of the present disclosure and the accompanying drawings. However, the drawings are provided for reference and description only, which is not intended to limit the disclosure.

DESCRIPTION OF DRAWINGS

Technical solutions and other beneficial effects of the present disclosure will be apparent from following detailed description of specific embodiments of the present disclosure with combination of the drawings.

In the drawings.

DETAILED DESCRIPTION OF PREFERRED EMBODIMENTS

In order to further clarify technical means and effects of the present disclosure, the following detailed description will be made in conjunction with preferred embodiments and the accompanying drawings of the present disclosure.

Figure 1:
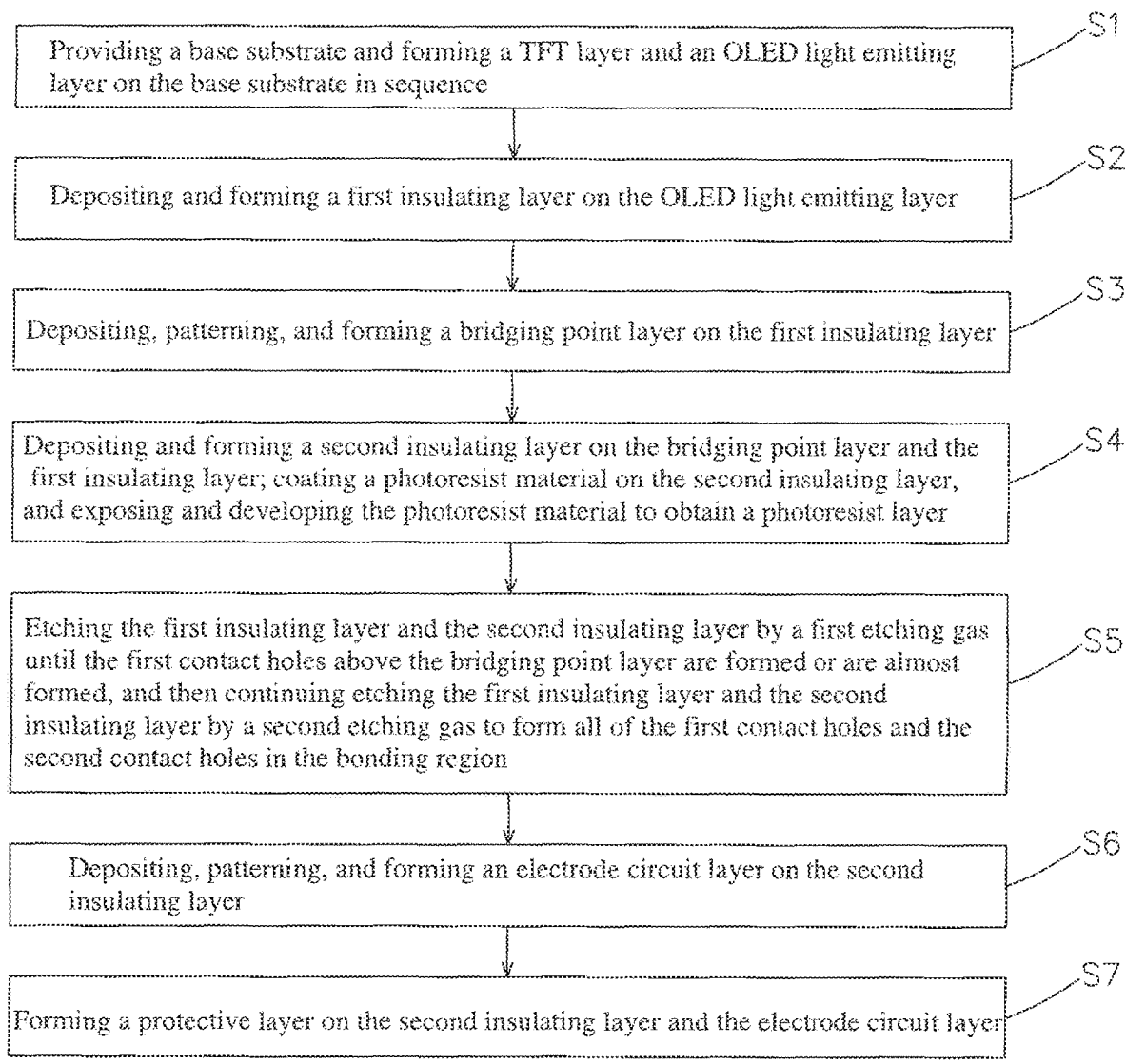
FIG. 1 is a flowchart of a method of fabricating an organic light-emitting diode (OLED) touch display screen.

Referring to FIG. 1, the present disclosure provides a method of fabricating an organic light-emitting diode (OLED) touch display screen. The OLED touch display screen comprises a pixel region located at a middle portion of the OLED touch display screen and a bonding region at an outer side of the pixel region. The method comprises following steps.

Figure 2:
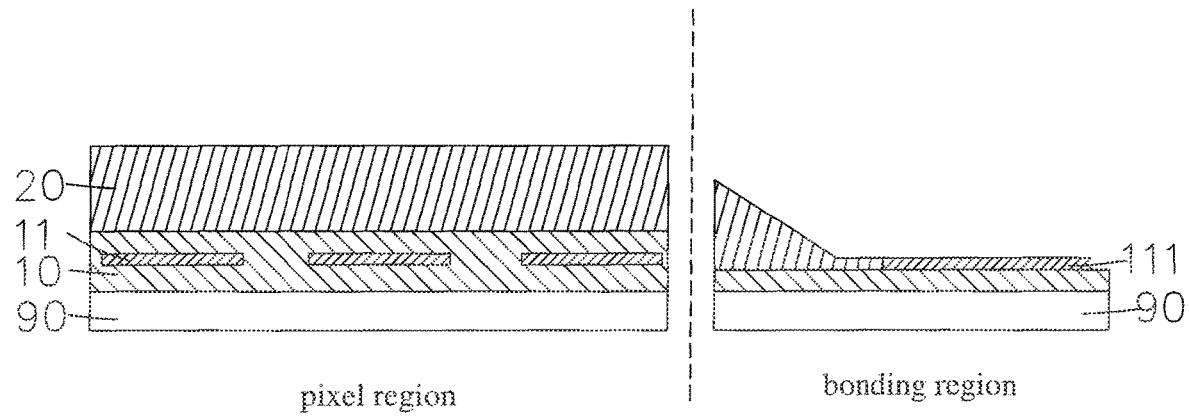
FIG. 2 is a schematic diagram of a step S1 of a method of fabricating the OLED touch display screen.

In a step S1, as shown in FIG. 2, a base substrate 90 is provided, and a thin film transistor (TFT) layer 10 and an OLED light emitting layer 20 are formed on the base substrate 90 in sequence.

Specifically, in the step S1, the TFT layer 10 includes a buffer layer, an active layer, a gate insulating layer, a gate electrode layer, an interlayer insulating layer, a source/drain electrode layer 11, and a planarization layer, wherein the source/drain electrode layer 11 includes touch lines 111 in the bonding region and bonding pads.

Specifically, in the step S1, the OLED light emitting layer 20 includes an anode layer, a pixel defining layer, an organic light emitting functional layer, and a cathode layer.

Figure 3:
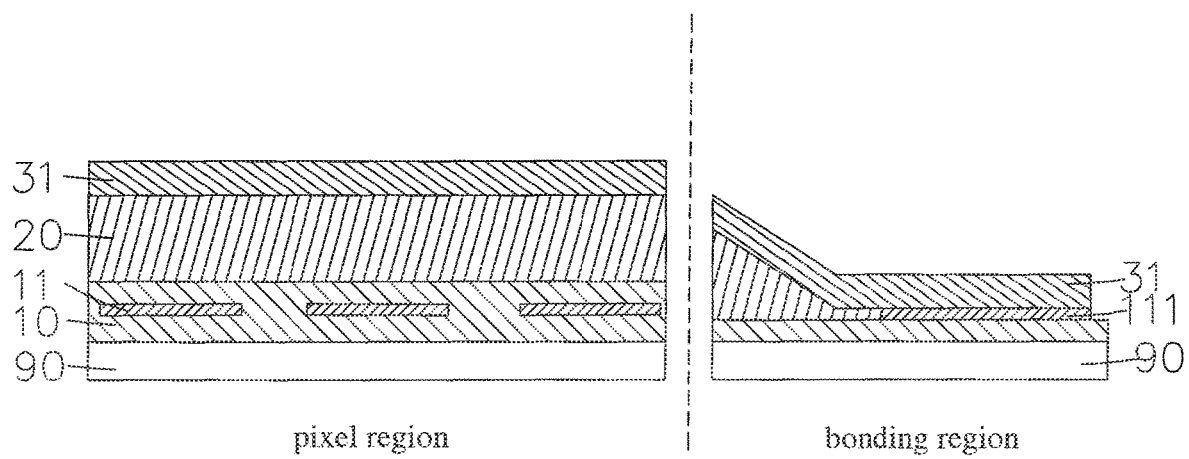
FIG. 3 is a schematic diagram of a step S2 of the method of fabricating the OLED touch display screen.

In step S2, as shown in FIG. 3, a first insulating layer 31 is deposited and formed on the OLED light emitting layer 20. The first insulating layer 31 is used to treat an adhesive force between a touch layer and the OLED light-emitting layer 20 to improve a surface quality, and used to protect the source-drain electrode layer 11, simultaneously.

Specifically, material of the first insulating layer 31 is silicon nitride ($SiN_x$).

Figure 4:
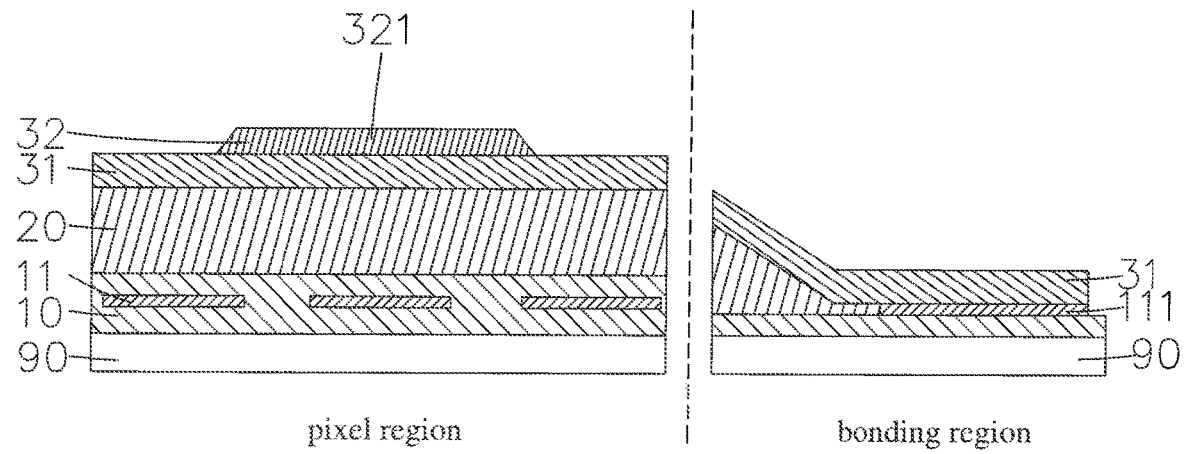
FIG. 4 is a schematic diagram of a step S3 of the method of fabricating the OLED touch display screen.

In step S3, as shown in FIG. 4, a bridging point layer 32 is deposited, patterned, and formed on the first insulating layer 31 to form a bridging point pattern.

Specifically, in the step S3, the bridging point layer 32 comprises a plurality of metal bridges 321 in the pixel region.

Specifically, in the step S3, a specific process of patterning and forming the bridging point layer 32 comprises a photoresist coating step, an exposing step, a developing step, an etching step, and a photoresist removing step, all of which are performed in sequence, wherein the etching step of patterning the bridging point layer 32 is performed by a dry etching process.

Figure 5:
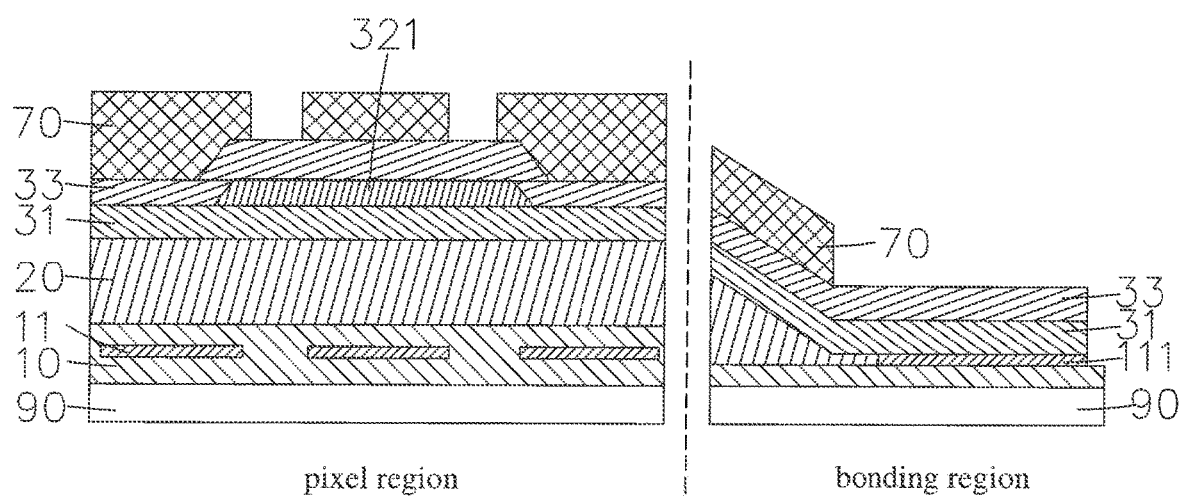
FIG. 5 is a schematic diagram of a step S4 of the method of fabricating the OLED touch display screen.

In a step S4, as shown in FIG. 5, a second insulating layer 33 used to protect the bridging point layer 32 is deposited and formed on the bridging point layer 32 and the first insulating layer 31. A photoresist material is coated on the second insulating layer 33. The photoresist material is exposed and developed to obtain a photoresist layer 70.

Specifically, material of the second insulating layer 33 is silicon nitride.

Figure 6:
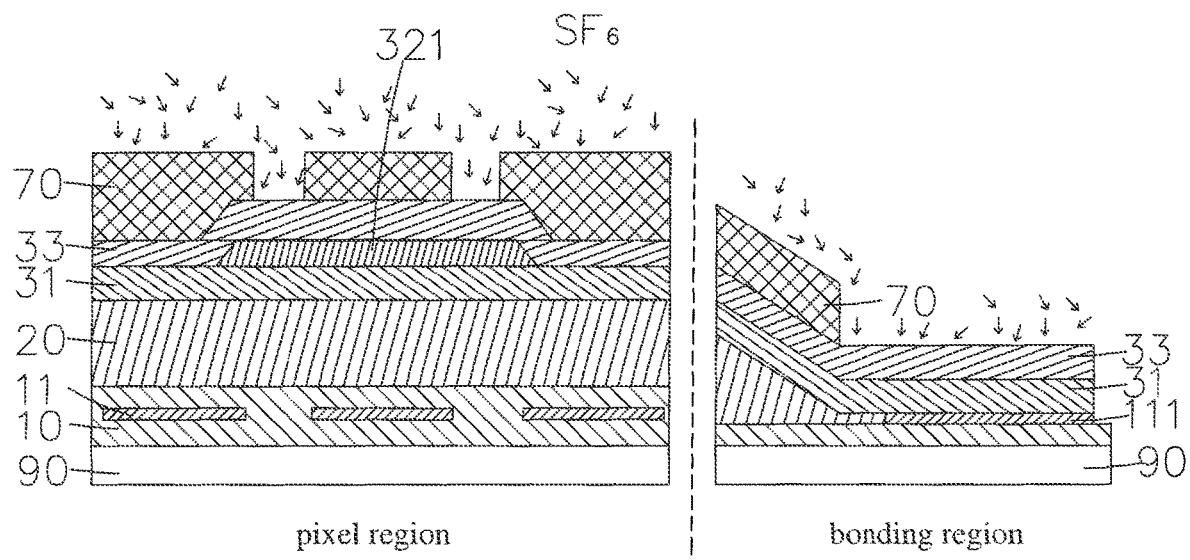
FIGS. 6-8 are schematic diagrams of a step S5 of the method of fabricating the OLED touch display screen.
Figure 7:
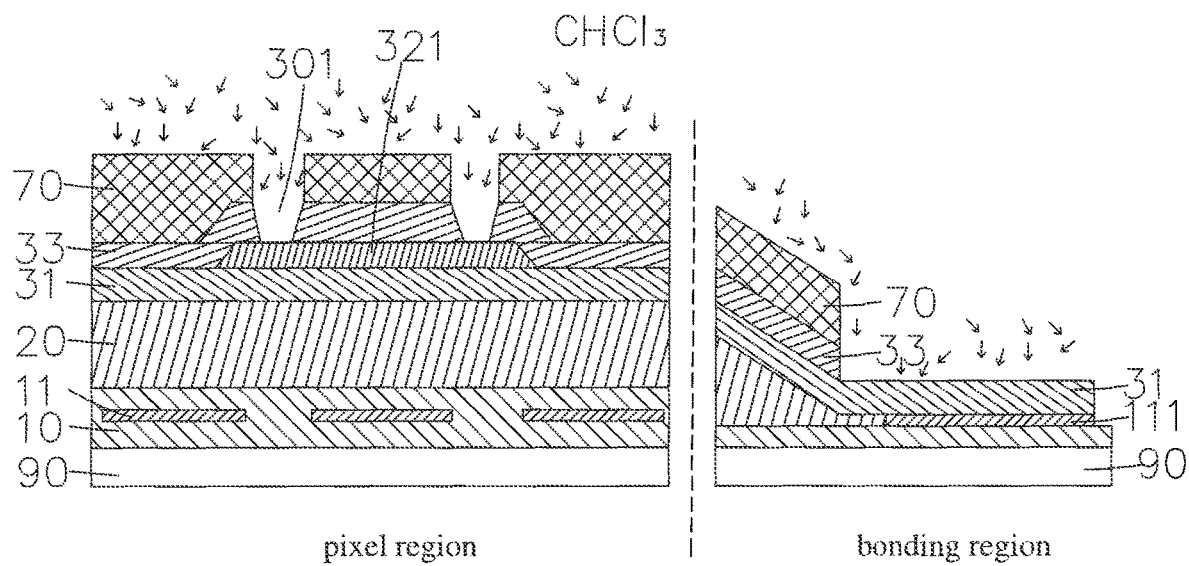
Figure 8:
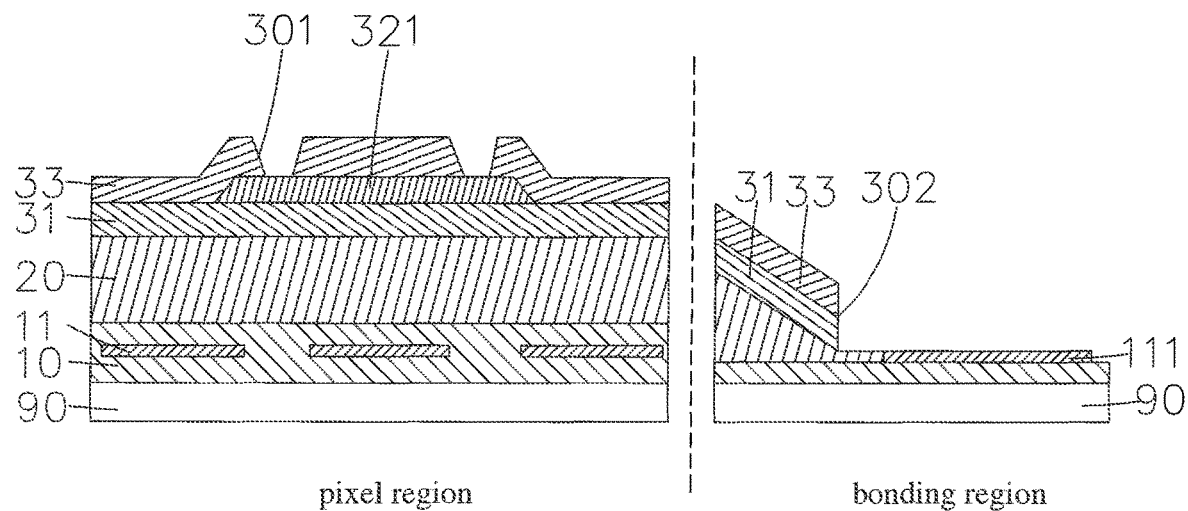

In a step S5, as shown in FIGS. 6-8, a dry etching process is performed on the first insulating layer 31 and the second insulating layer 33 by using the photoresist layer 70 as a shielding layer, so as to form: first contact holes 301 passing through the second insulating layer 33 and located above the bridging point layer 32 in the pixel region; and second contact holes 302 passing through the first insulating layer 31 and the second insulating layer 33 and formed in the bonding region. The dry etching process is specifically of: at first, etching the first insulating layer 31 and the second insulating layer 33 by a first etching gas until the first contact holes 301 are formed or until the first contact holes 301 are almost formed (a thickness of the second insulating layer exposed by the photoresist layer is less than 100 Å), then continuing etching the first insulating layer 31 and the second insulating layer 33 by a second etching gas to form all of the first contact holes 301 and the second contact holes 302, wherein an etching selectivity ratio of the second etching gas to the first insulating layer 31 and the bridging point layer 32 is greater than 5.

Specifically, in the step S5, the first etching gas should have a relatively great etching rate of the second insulating layer 33, specifically should be greater than 100 Å/S. The etching selectivity ratio of the second etching gas to the first insulating layer 31 and the bridging point layer 32 is greater than an etching selectivity ratio of the first etching gas to the first insulating layer 31 and the bridging point layer 32.

Specifically, in the present embodiment, in the step S5, the first etching gas comprises sulfur hexafluoride ($SF_6$) and oxygen ($O_2$). The second etching gas comprises trichloromethane ($CHCl_3$). A specific reaction principle is as follows:

$SF_6+O_2$:

$SF_6 \rightarrow SF_5, SF_4{}^*, SF_3{}^*, SF_2{}^*, SF^*, F^*$;

$S\uparrow + O_2\uparrow \rightarrow SO_2\uparrow$; and $SiNx + F \rightarrow SiF_4\uparrow + N_2\uparrow$.

$CHCl_3$:

$CHCL_3 \rightarrow CHCl_2{}^*, CCl_3{}^*, Cl^*, H^*$;

$H^* + Cl^* \rightarrow HCl\uparrow$; and $SiNx + Cl^* \rightarrow SiF_4\uparrow + N_2\uparrow$.

It should be noted that, since it only needs to etch a layer of $SiN_x$ (the second insulating layer 33) to form the first contact holes 301 in the pixel region and needs to etch a thickness of two layers of $SiN_x$ (the first insulating layer 31 and the second insulating layer 33) to form the second contact holes 302 in the bonding region, at a time of etching, an etch gas mainly composed of $SF_6$ (or $CF_4$) with a high $SiN_x$ etching rate is first introduced. Furthermore, since an etching selectivity ratio of $SF_6$ to $SiN_x$ and metal is small and the etching rate of SiNx and metal is almost equal to each other, it is not advisable to continue etching by using $SF_6$. When the etching of the first contact holes 301 is completed or nearly completed, it should be replaced with an etching gas with a relatively great etching ratio of $SiN_x$ and metal, such as an etching gas mainly composed of $CHCl_3$ (the etching rate of $CHCl_3$ to metal Ti is about 5 Å/s) to remove the remaining $SiN_x$.

In addition, in this embodiment, it is not preferable to directly etch the first insulating layer 31 and the second insulating layer 33 by using $CHCl_3$ as an etching gas because the etching rate to $SiN_x$ is relatively small (about 40 Å/s), if used directly, a used process time is too long. $SF_6$ reacts to $SiN_x$ quickly (about 200 angstroms/s), and etching time is relatively less, but its corrosion to metal is relatively serious. Therefore, the two etching gases cooperate to complete the etching of a whole process. At this time, some metal in the bridging point layer 32 will be slightly eroded, but does not affect overall performance.

Figure 9:
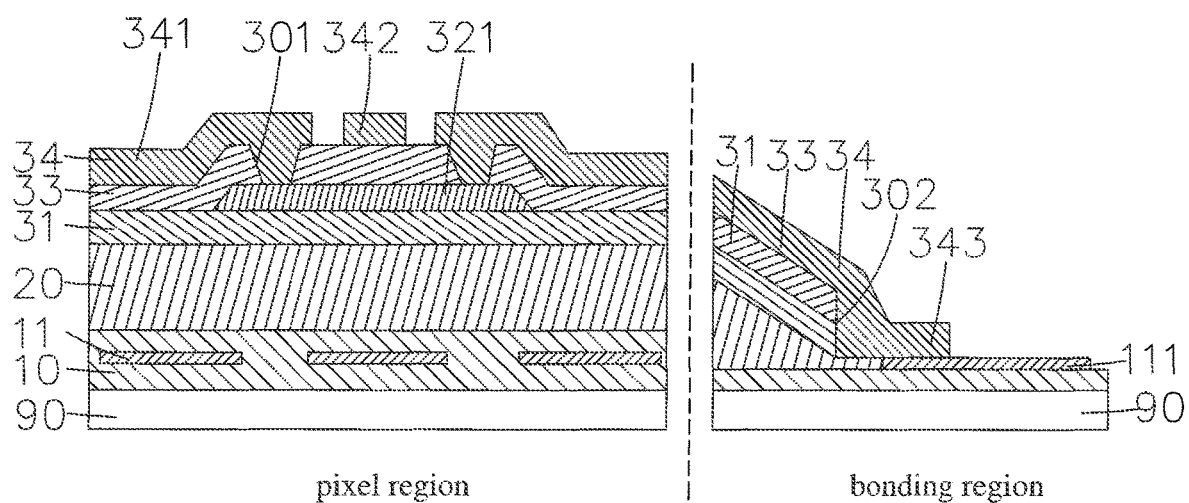
FIG. 9 is a schematic diagram of a step S6 of the method of fabricating the OLED touch display screen.

In step S6, as shown in FIG. 9, an electrode circuit layer 34 is deposited, patterned, and formed on the second insulating layer 33.

Specifically, in the step S6, the electrode circuit layer 34 comprises at least two first electrodes 341, at least one second electrode 342, and a plurality of third electrodes 343, wherein the first electrode 341 is one of a touch driving electrode and a touch sensing electrode, and the second electrode 342 is the other of the touch driving electrode and the touch sensing electrode. The first electrodes 341 are connected with the metal bridges 321 through the first contact holes 301. The third electrodes 343 are connected with the touch lines 111 in the bonding region through the second contact holes 302.

Specifically, in the step S6, a specific process of pattering and forming the electrode circuit layer 34 comprises a photoresist coating step, an exposing step, a developing step, an etching step, and a photoresist removing step, all of which are performed in sequence, wherein the etching step of patterning the electrode circuit layer 34 is performed by a dry etching process.

Figure 10:
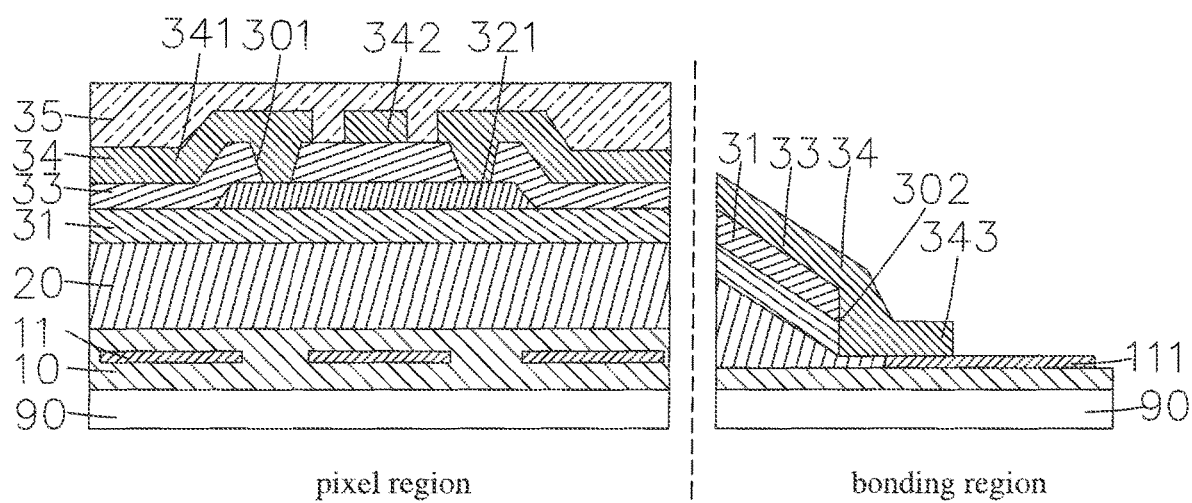
FIG. 10 is a schematic diagram of a step S7 of the method of fabricating the OLED touch display screen.

In a step S7, as shown in FIG. 10, a protective layer 35 is formed on the electrode circuit layer 34 and the second insulating layer 33 to obtain a sensing layer including the first insulating layer 31, the bridging point layer 32, the second insulating layer 33, the electrode circuit layer 34, and the protective layer 35. The protective layer 35 covers the OLED light emitting layer 20, and only the bonding pad pattern is exposed.

Specifically, in the step S7, the protective layer 35 is an inorganic protective layer, and material of the protective layer 35 is an inorganic material. A specific process of forming the protective layer 35 comprises a depositing inorganic material film step, a photoresist coating step, an exposing step, a developing step, an etching step, and a photoresist removing step, all of which are performed in sequence, wherein the etching step of forming the protective layer 35 is performed by a dry etching process. Or, the protective layer 35 is an organic protective layer, and material of the protective layer 35 is an organic material. In the step S7, the protective layer is formed by a yellow light process, and a specific process comprises an organic material coating step, an exposing step, and a developing step, all of which are performed in sequence.

A method of fabricating an OLED touch display screen is provided. Compared with prior art, the first insulating layer 31 is not etched after depositing the first insulating layer 31 and before depositing the bridging point layer 32. After depositing and forming the second insulating layer 33, the first insulating layer 31 and the second insulating layer 33 are dry-etched together using a combination of two etching gases to achieve fabricating two different depths contact holes in the touch layer in a same process, which effectively reduces erosion of the OLED by a wet-etching process, simplifies a producing process, improves device-producing capacity, and simultaneously achieves a pre-protection effect on the touch lines 111 and the bonding pads in the source-drain electrode layer 11 to avoid a functional failure caused by over-etching or oxidation.

From above, a method of fabricating an OLED touch display screen is provided and includes steps of forming a TFT layer, an OLED layer, and a touch layer on a base substrate sequentially. Compared with prior art, upon fabricating the touch layer, a first insulating layer is not etched after depositing the first insulating layer and before depositing a bridging point layer. After depositing and forming a second insulating layer, the first and second insulating layers are dry-etched together using a combination of two etching gases to achieve fabricating two different depths contact holes in the touch layer in a same process, which effectively reduces erosion of the OLED by a wet-etching process, simplifies a producing process, improves device-producing capacity, and simultaneously achieves a pre-protection effect on touch lines and bonding pads in a source-drain electrode layer to avoid a functional failure caused by over-etching or oxidation.

In the above, various other changes and modifications can be made in accordance with the technical solutions and technical concept of the present disclosure, and all such changes and modifications are within the scope of the claims of the present disclosure.

The invention claimed is:

1. A method of fabricating an organic light-emitting diode (OLED) touch display screen, the OLED touch display screen comprising a pixel region located at a middle portion of the OLED touch display screen and a bonding region at an outer side of the pixel region, the method comprising:

a step S1 of providing a base substrate and forming a thin film transistor (TFT) layer and an OLED light emitting layer on the base substrate in sequence;

a step S2 of depositing and forming a first insulating layer on the OLED light emitting layer;

a step S3 of depositing, patterning, and forming a bridging point layer on the first insulating layer;

a step S4 of depositing and forming a second insulating layer on the bridging point layer and the first insulating layer; coating a photoresist material on the second insulating layer, and exposing and developing the photoresist material to obtain a photoresist layer;

a step S5 of performing a dry etching process on the first insulating layer and the second insulating layer by using the photoresist layer as a shielding layer, so as to form:

first contact holes passing through the second insulating layer and located above the bridging point layer in the pixel region; and second contact holes passing through the first insulating layer and the second insulating layer and formed in the bonding region;

wherein the dry etching process is specifically of: at first, etching the first insulating layer and the second insulating layer by a first etching gas until the first contact holes are formed or a thickness of the second insulating layer exposed by the photoresist layer is less than 100 Å, then continuing etching the first insulating layer and the second insulating layer by a second etching gas to form all of the first contact holes and the second contact holes, wherein an etching selectivity ratio of the second etching gas to the first insulating layer and the bridging point layer is greater than 5;

a step S6 of depositing, patterning, and forming an electrode circuit layer on the second insulating layer; and a step S7 of forming a protective layer on the second insulating layer and the electrode circuit layer.

2. The method of fabricating the OLED touch display screen according to claim 1, wherein in the step S5, the first etching gas has an etching rate of the second insulating layer greater than 100 Å/S, and the etching selectivity ratio of the second etching gas to the first insulating layer and the bridging point layer is greater than an etching selectivity ratio of the first etching gas to the first insulating layer and the bridging point layer.

3. The method of fabricating the OLED touch display screen according to claim 1, wherein in the step S5, the first etching gas comprises sulfur hexafluoride and oxygen.

4. The method of fabricating the OLED touch display screen according to claim 1, wherein in the step S5, the second etching gas comprises trichloromethane.

5. The method of fabricating the OLED touch display screen according to claim 1, wherein material of both of the first insulating layer and the second insulating layer is silicon nitride.

6. The method of fabricating the OLED touch display screen according to claim 1, wherein:

in the step S1, the TFT layer comprises a source/drain electrode layer including touch lines in the bonding region;

in the step S3, the bridging point layer comprises a plurality of metal bridges in the pixel region; and in the step S6, the electrode circuit layer comprises at least two first electrodes, at least one second electrode, and a plurality of third electrodes, wherein the at least two first electrodes are connected with the metal bridges through the first contact holes, and the third electrodes are connected with the touch lines in the bonding region through the second contact holes.

7. The method of fabricating the OLED touch display screen according to claim 1, wherein in the step S3, a specific process of patterning and forming the bridging point layer comprises a photoresist coating step, an exposing step, a developing step, an etching step, and a photoresist removing step, all of which are performed in sequence, wherein the etching step of pattering the bridging point layer is performed by a dry etching process.

8. The method of fabricating the OLED touch display screen according to claim 1, wherein in the step S6, a specific process of pattering and forming the electrode circuit layer comprises a photoresist coating step, an exposing step, a developing step, an etching step, and a photoresist removing step, all of which are performed in sequence, wherein the etching step of patterning the electrode circuit layer is performed by a dry etching process.

9. The method of fabricating the OLED touch display screen according to claim 1, wherein in the step S7, material of the protective layer is an inorganic material, and a specific process of forming the protective layer comprises a depositing inorganic material film step, a photoresist coating step, an exposing step, a developing step, an etching step, and a photoresist removing step, all of which are performed in sequence, wherein the etching step of forming the protective layer is performed by a dry etching process.

10. The method of fabricating the OLED touch display screen according to claim 1, wherein in the step S7, the material of the protective layer is an organic material, and a specific process of forming the protective layer comprises an organic material coating step, an exposing step, and a developing step, all of which are performed in sequence.

* * * * *